(12) United States Patent
Mushell et al.

(10) Patent No.: US 7,901,847 B2
(45) Date of Patent: Mar. 8, 2011

(54) USE OF SOFT ADHESIVE TO ATTACH PELLICLE TO RETICLE

(75) Inventors: David Mushell, San Jose, CA (US); Henry Yun, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 12/316,086

(22) Filed: Dec. 8, 2008

(65) Prior Publication Data
US 2010/0143829 A1    Jun. 10, 2010

(51) Int. Cl.
*G03F 1/00*    (2006.01)
(52) U.S. Cl. ............................................................ 430/5
(58) Field of Classification Search ........ 430/5; 428/14; 355/75
See application file for complete search history.

(56) References Cited

U.S. PATENT DOCUMENTS

| | | | |
|---|---|---|---|
| 6,303,196 B1 * | 10/2001 | Funatsu ........................... | 428/14 |
| 6,627,365 B1 * | 9/2003 | Shiraishi ......................... | 430/30 |
| 6,795,170 B2 * | 9/2004 | Mishiro et al. .................. | 355/75 |
| 2004/0200572 A1 * | 10/2004 | Tejnil et al. ................. | 156/345.1 |
| 2006/0033905 A1 | 2/2006 | Toofan et al. | |
| 2008/0213679 A1 * | 9/2008 | Miyakawa et al. ............... | 430/5 |

OTHER PUBLICATIONS

U.S. Appl. No. 12/060,220, filed Mar. 31, 2008.

* cited by examiner

*Primary Examiner* — Stephen Rosasco
*Assistant Examiner* — Stewart A Fraser
(74) *Attorney, Agent, or Firm* — Winkle, PLLC

(57) ABSTRACT

A pellicle is attached to a reticle by a soft adhesive. The distortion of the reticle is less than if a hard adhesive were used.

18 Claims, 9 Drawing Sheets

USE OF SOFT ADHESIVE TO ATTACH PELLICLE TO RETICLE

BACKGROUND

Background of the Invention

Lithographic reticles are employed for patterning substrate areas. Pellicles are employed on the patterned side of the reticle to prevent propagation of particle-related defects into patterns imaged onto the substrate. The pellicle typically includes a perimeter of walls which are attached by an adhesive to the reticle.

DETAILED DESCRIPTION

Various embodiments of a pellicle attached to a reticle are discussed in the following description. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative example representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
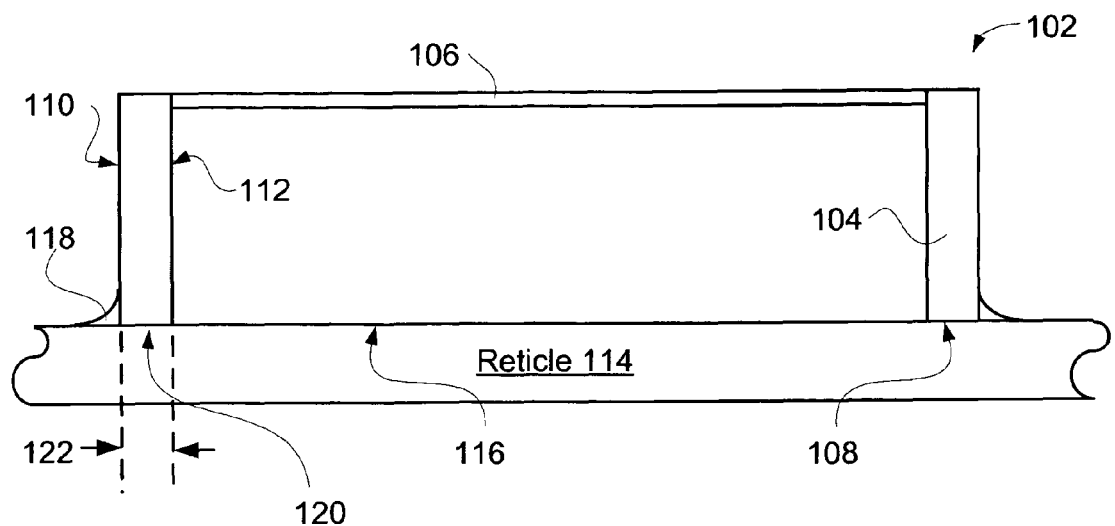
FIG. 1 is a cross sectional side view that illustrates a pellicle attached to a reticle.

FIG. 1 is a cross sectional side view that illustrates a pellicle 102 attached to a reticle 114, according to one embodiment of the described invention. In an embodiment, the pellicle 102 includes a pellicle frame 104 and a pellicle membrane 106 attached to the pellicle frame 104. In other embodiments, the pellicle 102 may be a single piece of material rather than a frame 104 plus membrane 106 or may have other parts in addition to the frame 104 and membrane 106. Pellicle membranes 106 may comprise "soft" polymer-based materials, "hard" silica-based materials, or other suitable materials. Pellicle frame 104 may be a metal, such as anodized aluminum, which can be relatively inexpensively machined and kept clean during use. Other materials suitable for a structural frame 104 can be used in other embodiments.

The reticle 114 has a pattern to be used in patterning a material in a lithography process. A reticle, or photomask, as shown in FIG. 1 comprises a patterned material, the pattern to be transferred to a layer on a substrate via a lithography process. The reticle 114 may comprise quartz in an embodiment, although other materials such as a glass may be used. The bottom surface 108 of the pellicle 102 may be in contact with or adjacent the top surface 116 of the reticle 114.

The pellicle frame 104 is attached by an adhesive 118 to the reticle 114. In the illustrated embodiment, the adhesive 118 is in contact with a side surface 110 of the pellicle 102 and a top surface 116 of the reticle 114. The adhesive 118 is a soft adhesive 118 material with a shear modulus less than 3.0 in some embodiments. In some embodiments, the adhesive 118 has a shear modulus between about 1.5 and about 2.5. In other embodiments, the adhesive has a shear modulus between about 1.5 and about 3.0. In an embodiment, the adhesive 118 used is a soft polymer-based adhesive 118, although in other embodiments, an uv curable adhesive 118, a siloxane based adhesive 118, a silicon based adhesive 118, an acrylic based adhesive 118, or another adhesive 118 may be used. In some embodiments, the adhesive 118 may be a pressure sensitive adhesive 118, such as a siloxane based pressure sensitive adhesive 118.

The area 120 directly between the frame 104 and reticle 114 is substantially free from adhesive 118 in the embodiment illustrated in FIG. 1. As shown the adhesive 118 is adjacent the pellicle exterior side surface 110 and the reticle top surface 116, but does not substantially extend under the frame 104, so the area 122 between the pellicle exterior 110 and interior 112 is substantially free from adhesive 118. As the adhesive 118 is soft, there may be a small amount that extends into area 120 if the bottom of the pellicle frame 104 is not completely flush with the reticle 114 top surface 116, but the area 120 is substantially free from adhesive 118 in the illustrated embodiment. Such an arrangement allows the use of a soft adhesive material 118 that may outgas. Since the adhesive 118 is on the outside of the pellicle 104, the pellicle 104 will substantially block any outgassing products from reaching the interior 112 of the pellicle 104 where it may negatively affect the reticle 114 or pellicle membrane 106.

In other embodiments, there may be adhesive 118 beneath the pellicle frame 104. For example, if outgassing of the adhesive 118 is a concern, the pellicle frame 104 may have an inner lip adjacent the interior side surface 112 that extends to the reticle 114 top surface 116, with the exterior side surface 110 stopping short of the reticle 114 top surface 116 to form a region where adhesive 118 may extend laterally inward from the exterior surface 110 a distance under the pellicle frame 104 side wall, but not the full thickness 122 of the side wall. Such an arrangement would allow a portion of the pellicle frame 104 side wall to block outgassing products while still allowing adhesive between the pellicle 104 bottom surface 108 and reticle 114 top surface 116. In other embodiments where outgassing is not a concern, the soft adhesive 118 may be placed such that outgassing products are not blocked from reaching the volume at the interior 112 of the pellicle 102.

As the adhesive 118 is soft with a low shear modulus, it does not apply much force to the pellicle 102 or reticle 104, and thus causes less pellicle 102 or reticle 104 deformation than a harder adhesive might. Rather than transferring forces, the soft adhesive 118 may distort, allowing the reticle 114 to be relatively distortion-free. In contrast, the use of a hard adhesive may result in any distortion or non-flatness of the pellicle causing a force to be transferred by the hard adhesive to the reticle, causing distortion of that reticle. These potential stresses induced by the mounting of the pellicle 102 to reticle 114 may induce registration errors. These errors are particularly troublesome in multiple-patterning lithography methods where multiple reticles 114 are used in patterning exposures of a single patterning material layer and alignment of the multiple reticles 114 is used to ensure the pattern is correctly formed. Since the patterning material layer is patterned by multiple reticles 114, distortions of one or more of the reticles 114 can result in the features from one reticle 114 misaligned with features from another reticle 114. Thus, soft adhesive 118 can reduce the stress imparted on the reticle 114 by the pellicle 118 and improve the alignment of the various reticles 114 used in a multiple-patterning process. Hard adhesives like stiff siloxane-based adhesives, in contrast, can result in greater stress and distortion of the reticle 114.

Figure 2:
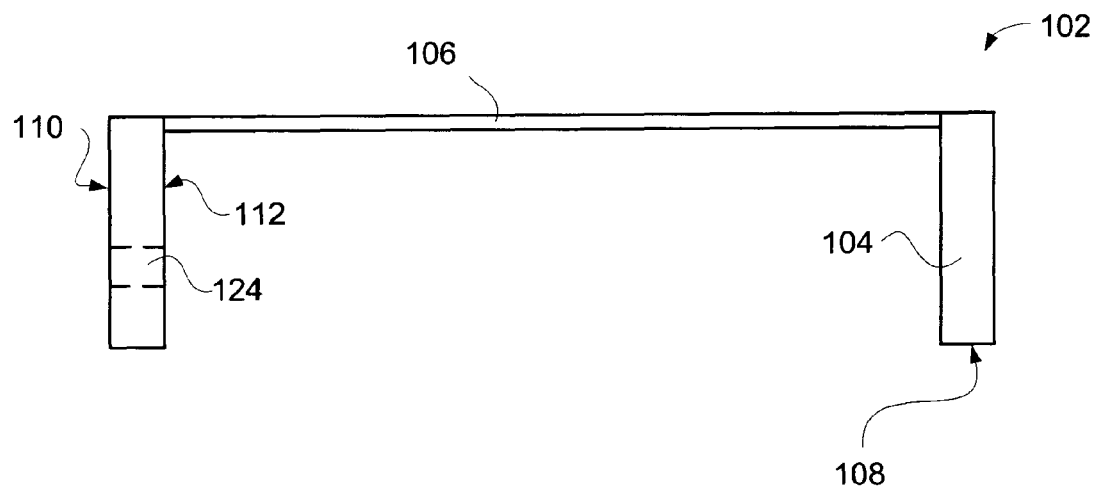
FIG. 2 is a cross sectional side view that illustrates one embodiment of a pellicle.

FIG. 2 is a cross sectional side view that illustrates one embodiment of a pellicle 102. The pellicle 102 in this embodiment includes a pellicle frame 104, a pellicle membrane 106, an exterior 110 and interior 112 of the pellicle 102 defined by the frame 104 and membrane 106, with the interior 112 including the pattern on the reticle 114 once the pellicle 102 is attached to the reticle 114. There is also a bottom surface 108 of the pellicle frame 104, which will contact or be adjacent to the reticle 114 when the pellicle 102 is attached to the reticle 114. There is also a vent 124 through the pellicle frame 104, through which gas may pass to equalize the pressure between the interior 112 and exterior 110 of the pellicle 102—reticle 114 assembly. Such a vent 124 may be of any suitable shape and type, and one or more of the vents 124 may be absent or present in any of the pellicle 102 embodiments discussed herein.

Figure 3:
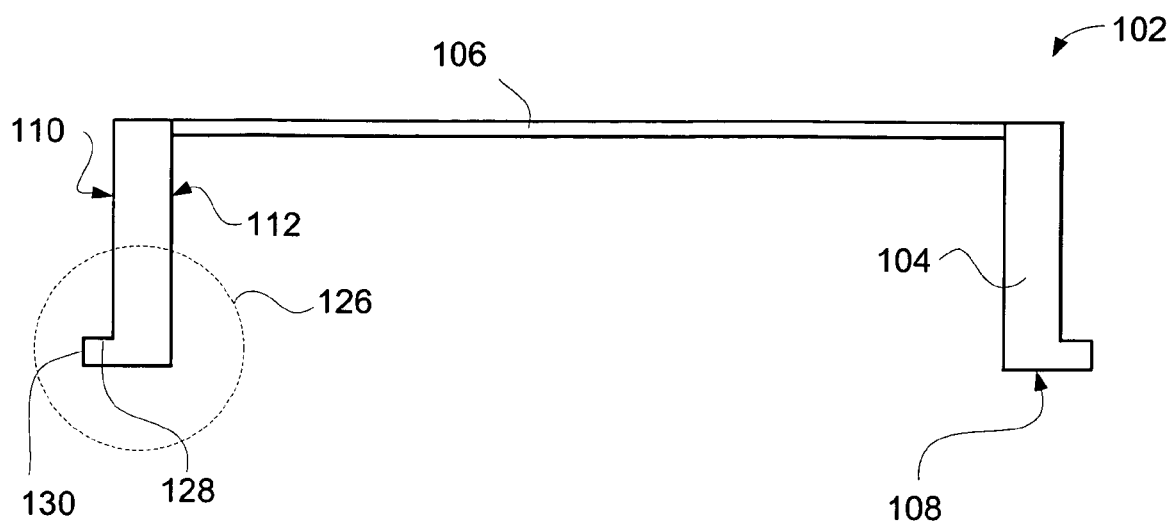
FIG. 3 is a cross sectional side view that illustrates a pellicle with a frame having a stepped cross section.
Figure 4:
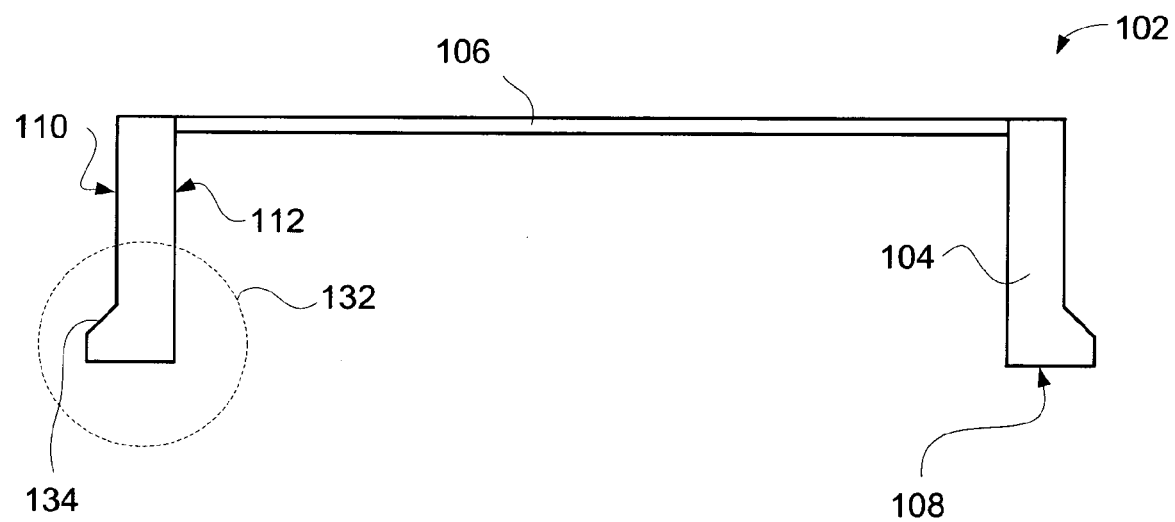
FIG. 4 is a cross sectional side view that illustrates another embodiment of the pellicle with a bottom portion that does not just extend vertically from the reticle surface.
Figure 5:
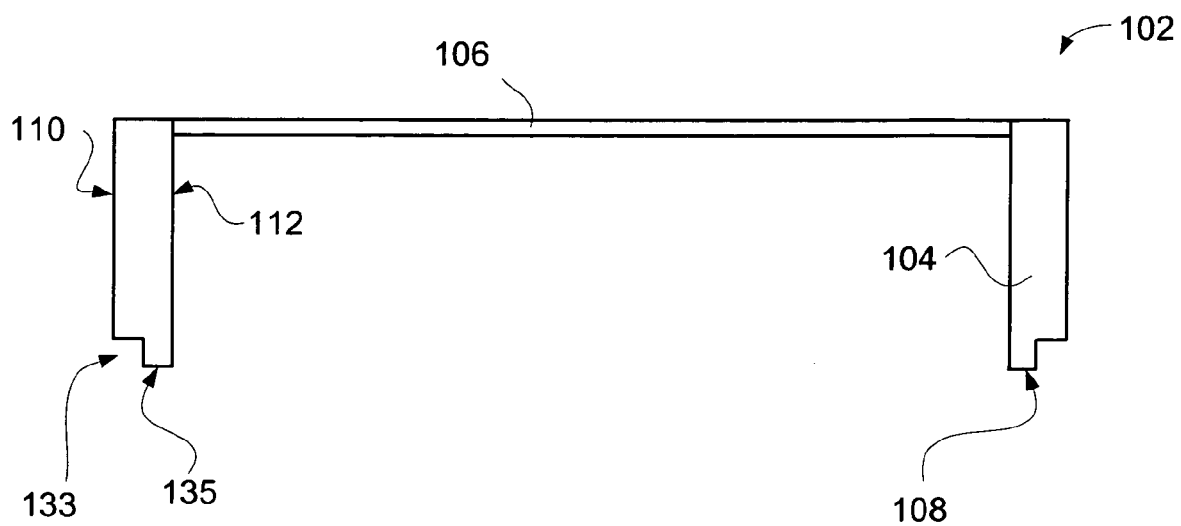
FIG. 5 is a cross sectional side view that illustrates another embodiment of the pellicle with a bottom portion that allows adhesive to be beneath the pellicle frame.

The side surfaces 110, 112 of the pellicle frame 104 are substantially vertical in the embodiment of FIG. 2. This means that when the adhesive 118 is used to attach the pellicle 114 to the reticle, the adhesive 118 is adjacent a vertical surface 110 of the pellicle 102 and the top surface 116 of the reticle 114 as illustrated in FIG. 1. FIGS. 3 through 5 show some of the many possible other configurations of the pellicle 102.

FIG. 3 is a cross sectional side view that illustrates a pellicle 102 with a frame 104 having a stepped cross section portion 126. The stepped cross section 126 has a horizontal portion 128 as well as a vertical portion 130 in the illustrated embodiment. In other embodiments, there may be more than one step of the stepped cross section 126. Such a stepped cross section 126 may allow the adhesive 118 to be adjacent a surface of the pellicle 102 that does not extend vertically from the reticle 114 surface 116, which may provide a more secure attachment between the reticle 114 and pellicle 102.

FIG. 4 is a cross sectional side view that illustrates another embodiment of the pellicle 102 with a bottom portion that does not just extend vertically from the reticle 114 surface 116. Instead the pellicle 102 has a portion with an angled cross section 132 where a portion of the exterior surface 110 is an angled portion 134. Such an angled surface 134 may allow the adhesive 118 to provide a more secure attachment between the reticle 114 and pellicle 102 than a purely vertical exterior surface 110.

FIG. 5 is a cross sectional side view that illustrates another embodiment of the pellicle 102 with a bottom portion that allows adhesive 118 to be beneath the pellicle frame 104 yet still blocks outgassing from reaching the pellicle interior 112. In the embodiment of FIG. 5, the pellicle 102 includes an inset portion 133 and an interior lip portion 135 that together create a pocket for adhesive to be beneath the pellicle 102. Substantially no adhesive 118 extends beneath the lip 135 portion, which therefore acts to block outgassing from reaching the pellicle 102 interior 112. Such a pocket may take various shapes and extend all the way around the perimeter of the pellicle 102 or only be present in portions.

Other pellicle 102 shapes in addition to those shown in FIGS. 2 through 5 may also be used in other embodiments.

Figure 6:
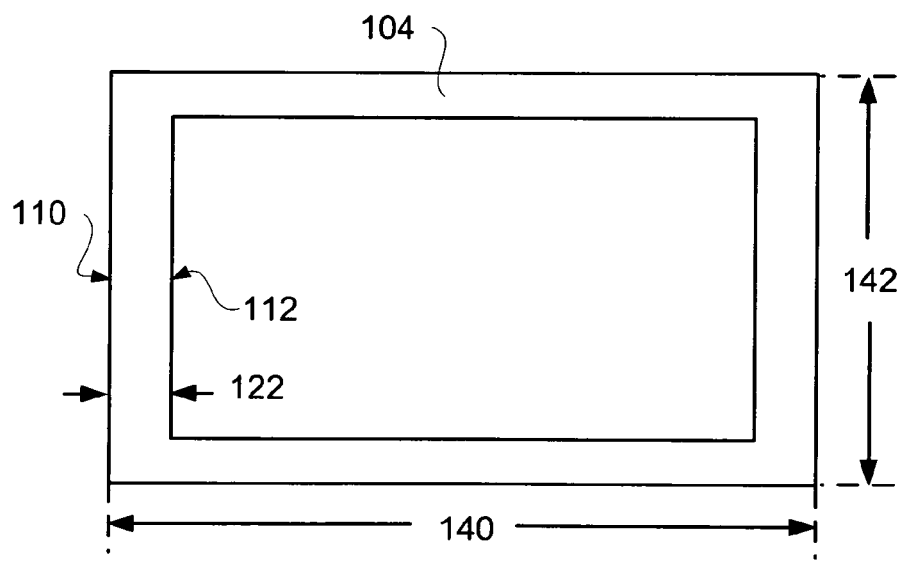
FIG. 6 is a top view that illustrates the one embodiment of a pellicle frame.

FIG. 6 is a top view that illustrates the one embodiment of a pellicle frame 104. FIG. 6 shows the outer perimeter of the pellicle frame 104. Pellicle frame 104 dimensions may vary for a given reticle size. As an example, referring to FIG. 6, the pellicle frame 104 may have a perimeter length 140 and perimeter width 142, each on the order of a few inches, and a frame width 122, of between approximately 2 mm and 5 mm. The pellicle frame 104 may have a sidewall height between approximately 3 mm and 8 mm. Other sizes may be used as appropriate, and shapes other than rectangular may be used as well.

Figure 7:
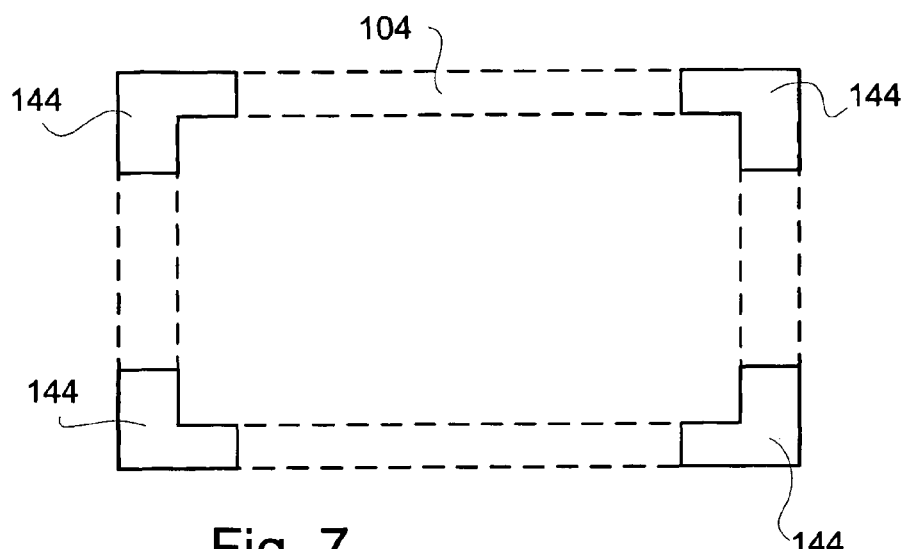
FIG. 7 is a bottom view that illustrates a pellicle frame with a bottom surface that does not extend around the entire perimeter of the pellicle.

FIG. 7 is a bottom view that illustrates a pellicle frame 104 with a bottom surface 108 that does not extend around the entire perimeter of the pellicle 102. In the embodiment shown in FIG. 7, only the corner sections extend down far enough to be adjacent to or contact the reticle 114 when the pellicle 102 is attached to the reticle 114. In other embodiments, the entire perimeter (the corners 144 plus the side areas indicated by dashed lines) of the pellicle frame 104 may extend to be adjacent to or contact the reticle 114 when the pellicle 112 is attached to the reticle 114 (in such embodiments, the pellicle 102 may substantially completely seal the interior 112 to effectively prevent or reduce the amount of outgassing products from the adhesive 118 from reaching the interior 112). In yet other embodiments, there may be partial contact between the reticle 114 and pellicle 102, with contact made at other locations in addition to, or in place of, at the corners 144.

Figure 8:
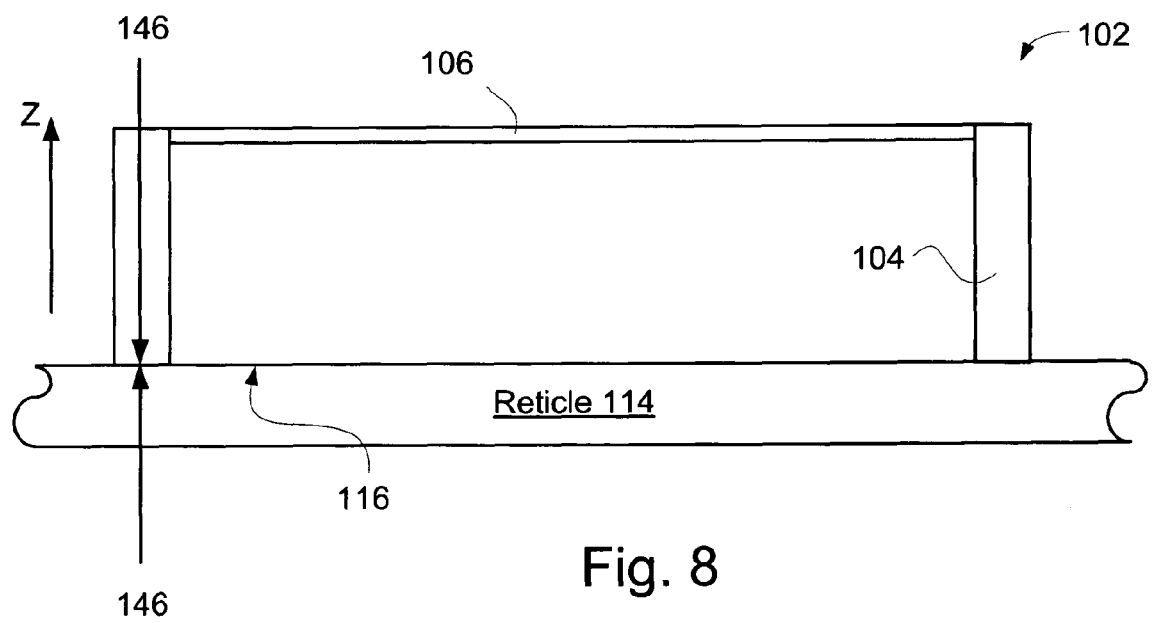
FIG. 8 is a cross sectional side view that illustrates an embodiment of how the pellicle may be attached to the reticle.

FIG. 8 is a cross sectional side view that illustrates an embodiment of how the pellicle 102 may be attached to the reticle 114. In the illustrated embodiment, the pellicle 102 is placed on the reticle 114 and is not held there with any force other than the pellicle's 102 own weight. FIG. 8 shows the force 146 (equal and opposite between pellicle 102 and reticle 114) normal to the reticle 114 surface 116. In an embodiment, the force 146 is equal in magnitude to the weight of the pellicle 102. That is, no additional force is pressing the pellicle 102 down on the reticle 114. In other embodiments, the force 146 may include small additional forces besides the weight of the pellicle 102, or the force 146 may be smaller than the weight of the pellicle 102. The force 146 is smaller than the force used to attach a pellicle 102 to a reticle 114 with a hard adhesive located directly between the pellicle 102 and reticle 114. Because the force 146 is smaller, the force-induced distortion of the reticle 114 is smaller than if a hard adhesive were used. With a hard adhesive, more force is used, such as the weight of the reticle (with the pellicle 102 on the bottom and reticle 114 on top) being used to attach the pellicle 102 to the reticle 114. Forces in addition to, or in place of the weight of the reticle 114 may be used with hard adhesives directly between pellicle 102 and reticle 114. This additional force or forces can result in distorted reticle 114.

In an embodiment, the force 146 is smaller than the weight of the reticle 114. In another embodiment, the force 146 used with the soft adhesive 118 is less than 50% of the weight of the reticle 114 (in such an embodiment, additional force 146 to the weight of the pellicle 102 may be used). In another embodiment, the force 146 used with the soft adhesive 118 is less than 25% of the weight of the reticle 114 (in such an embodiment, additional force 146 to the weight of the pellicle 102 may be used). In another embodiment, the force 146 is substantially equal to the weight of the pellicle 102. In an embodiment, the force 146 is at least 95% less than the weight of the reticle 114. In an embodiment the force 146 is at least 98.5% less than the weight of the reticle (for example, this embodiment may occur with a pellicle 102 having a weight of approximately 5 grams and reticle 114 having a weight of about 400 grams). In another embodiment, the pellicle 102 and reticle 114 are in contact but there is substantially no force 146 between the two.

Figure 9:
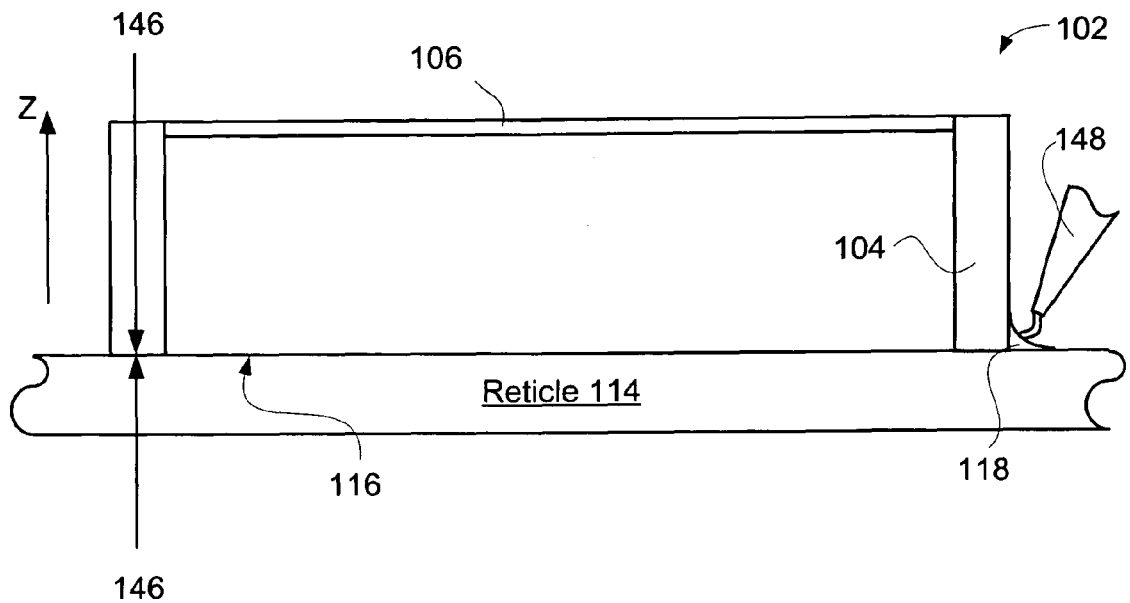
FIG. 9 is a cross sectional side view that illustrates application of the soft adhesive to attach the reticle to the pellicle.

FIG. 9 is a cross sectional side view that illustrates application of the soft adhesive 118 to attach the reticle 102 to the pellicle 114. In the illustrated embodiment, the adhesive 118 is applied to the perimeter of the pellicle 102 via a nozzle 148 after the pellicle 102 has been positioned on the reticle 114. Such an application adds substantially nothing to the force 146 between the pellicle 102 and reticle 114, so does not substantially contribute distortion to the reticle 114. As shown, the adhesive 118 is applied to be in contact with the pellicle frame 104 exterior side wall 110 and the top surface 116 of the reticle 114. Other suitable methods of applying the adhesive 118 may also be used, and the regions of contact between adhesive 118, pellicle 102 and reticle 114 may vary based on the configuration of the components. Some additional force 146 may be applied in some other adhesive 118 application methods.

Figure 10:
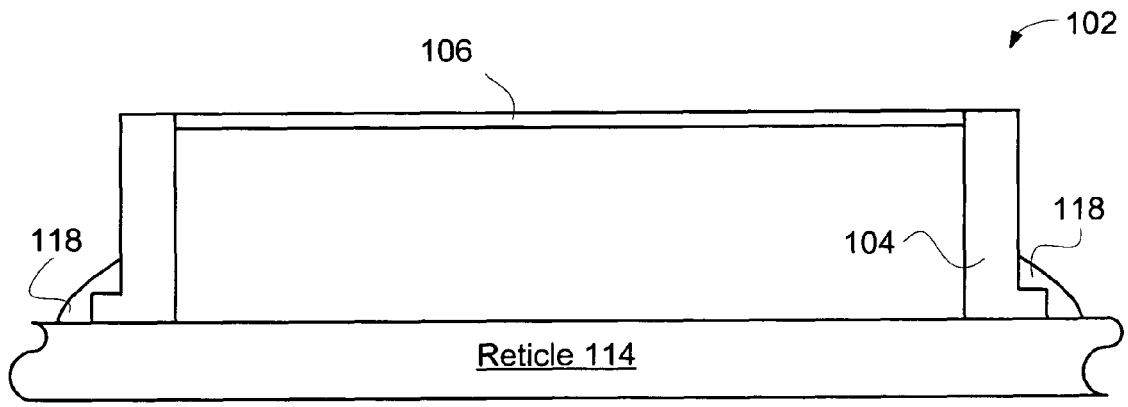
FIG. 10 is a cross sectional side view that illustrates the reticle adhered to the pellicle.

FIG. 10 is a cross sectional side view that illustrates the reticle 114 adhered to the pellicle 102 according to an embodiment where the pellicle 10 has a frame 104 with stepped side walls. As can be seen in FIG. 10, the stepped side wall portions 126 provide additional non-vertical surfaces to contact the adhesive 118 besides the vertical portions shown in FIG. 1, which may result in a more secure attachment of pellicle 102 to reticle 114 without an increase in force 146 between the pellicle 102 and reticle 114.

Figure 11:
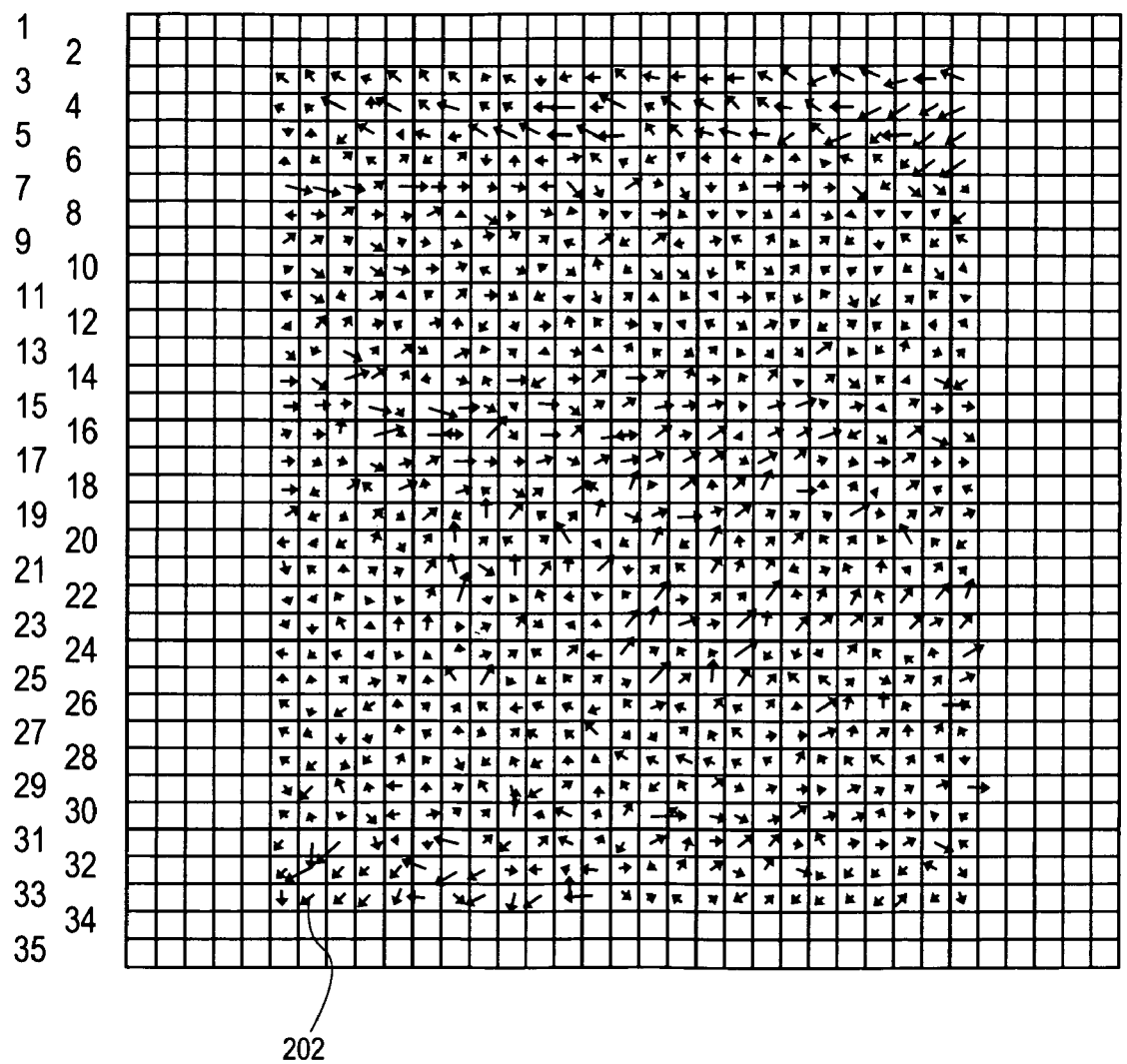
FIG. 11 is a graphical representation of the distortion at various points on the reticle with the pellicle attached with soft adhesive.

FIG. 11 is a graphical representation of the distortion at various points on the reticle 114 with the pellicle 102 attached with soft adhesive 118 as described above. The vectors 202 indicate the direction and magnitude of the distortion of the reticle 114 at the various points. As tested, the maximum three sigma distortion of the reticle 114 using the soft adhesive 118 attachment approach was less than 4.0 nanometers. In an embodiment, the maximum three sigma distortion of the reticle 114 using the soft adhesive 118 attachment approach was 3.9 nanometers in the X-direction (left-right along the figure) and 2.7 nanometers in the Y-direction (up-down along the figure). In an embodiment, using the soft adhesive 118 to attach the pellicle 102 to reticle 114, the distortion in each of the X- and Y-directions may be less than 2.0 nanometers. Even lower maximum three sigma distortion levels may be possible using the soft adhesive 118 attachment approach. This low level of distortion makes multiple patterning lithography much easier, as the feature placement of the various reticles 114 may be aligned more exactly to result in fewer alignment errors in the final product.

Figure 12:
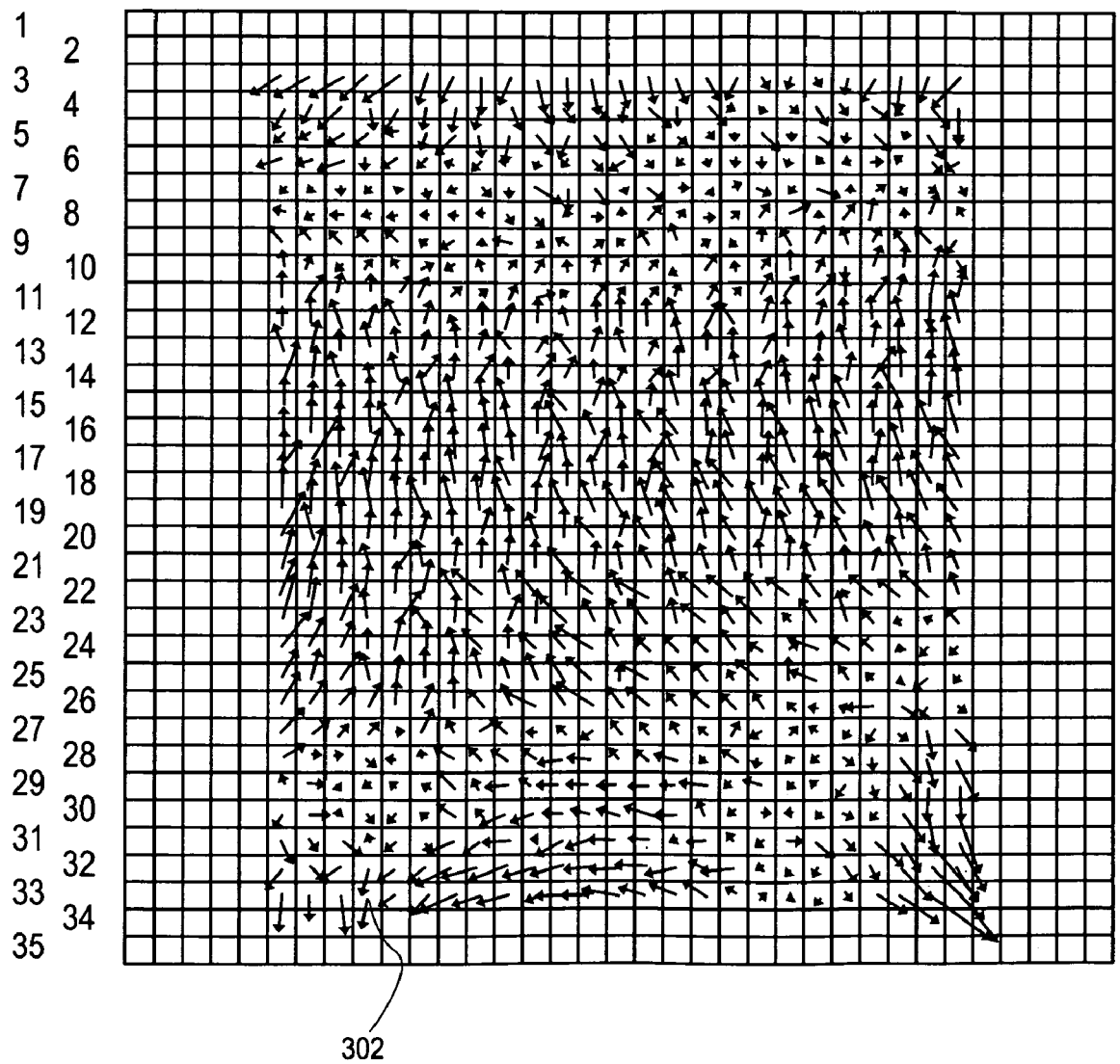
FIG. 12 is a graphical representation of the distortion at various points on the reticle with the pellicle attached with a hard adhesive.

FIG. 12 is a graphical representation of the distortion at various points on the reticle 114 with the pellicle 102 attached with a hard adhesive. The use of hard adhesives requires more force to be applied between the pellicle 102 and reticle 114 to attach the two components into an assembly. The hard adhesive may also transfer more forces caused by distortion of the pellicle 102 between the pellicle 102 and reticle 114. These potential additional forces can result in more distortion of the reticle 114 and greater alignment errors, which may make multiple patterning lithography more difficult or impossible. The vectors 302 indicate the direction and magnitude of the distortion of the reticle 114 at the various points. A simple comparison between FIGS. 11 and 12 make it clear that there is much more distortion when a hard adhesive is used (seen in FIG. 12) than when the disclosed soft adhesive 118 is used (FIG. 11). As tested, the maximum three sigma distortion of the reticle 114 using the hard adhesive attachment approach was greater than 5.0 nanometers. Thus, the use of soft adhesive 118 can provide at least a 20% reduction in distortion of the reticle 114.

Figure 13:
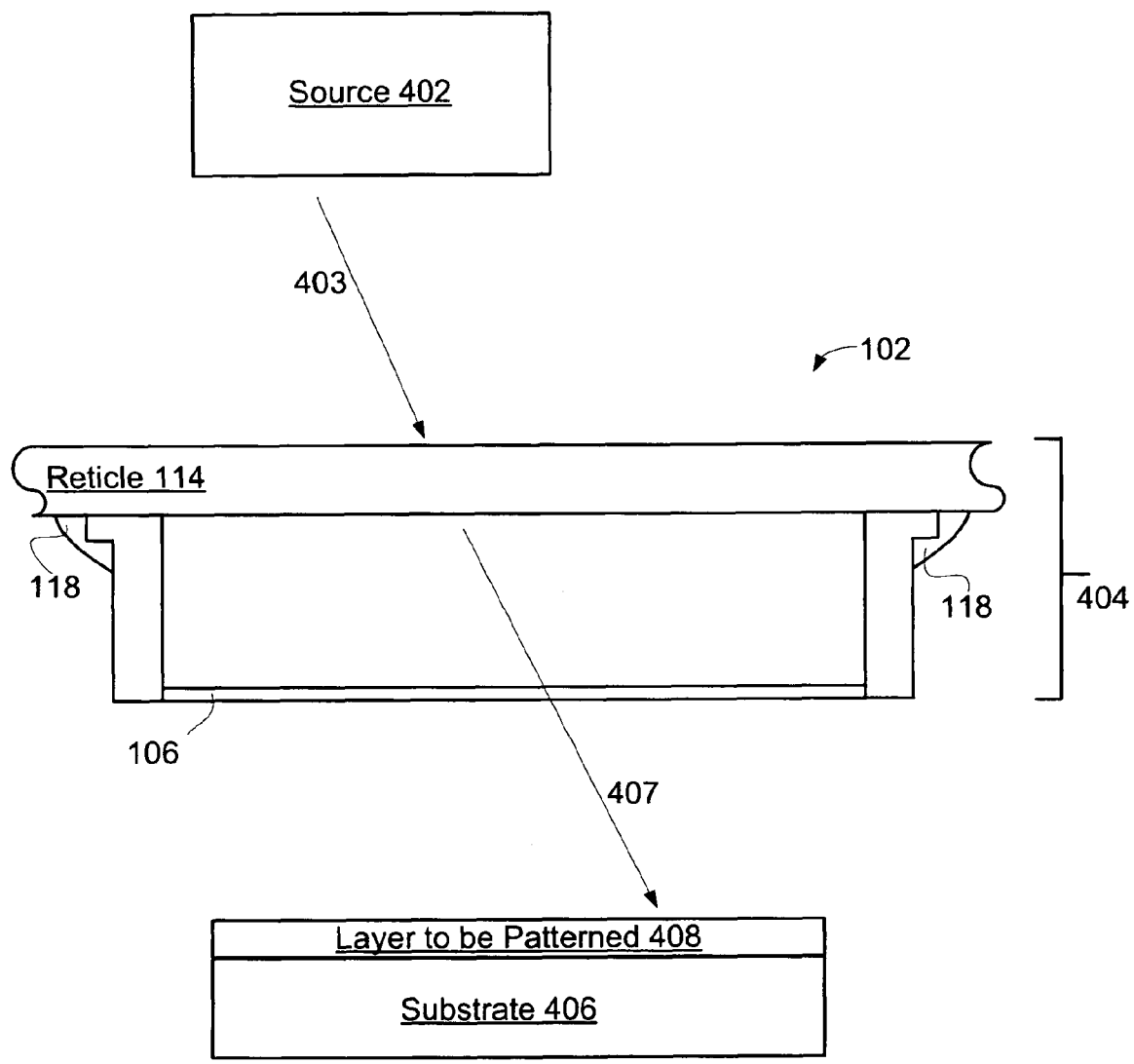
FIG. 13 illustrates a first patterning of a layer to be patterned with a first pellicle-reticle assembly.
Figure 14:
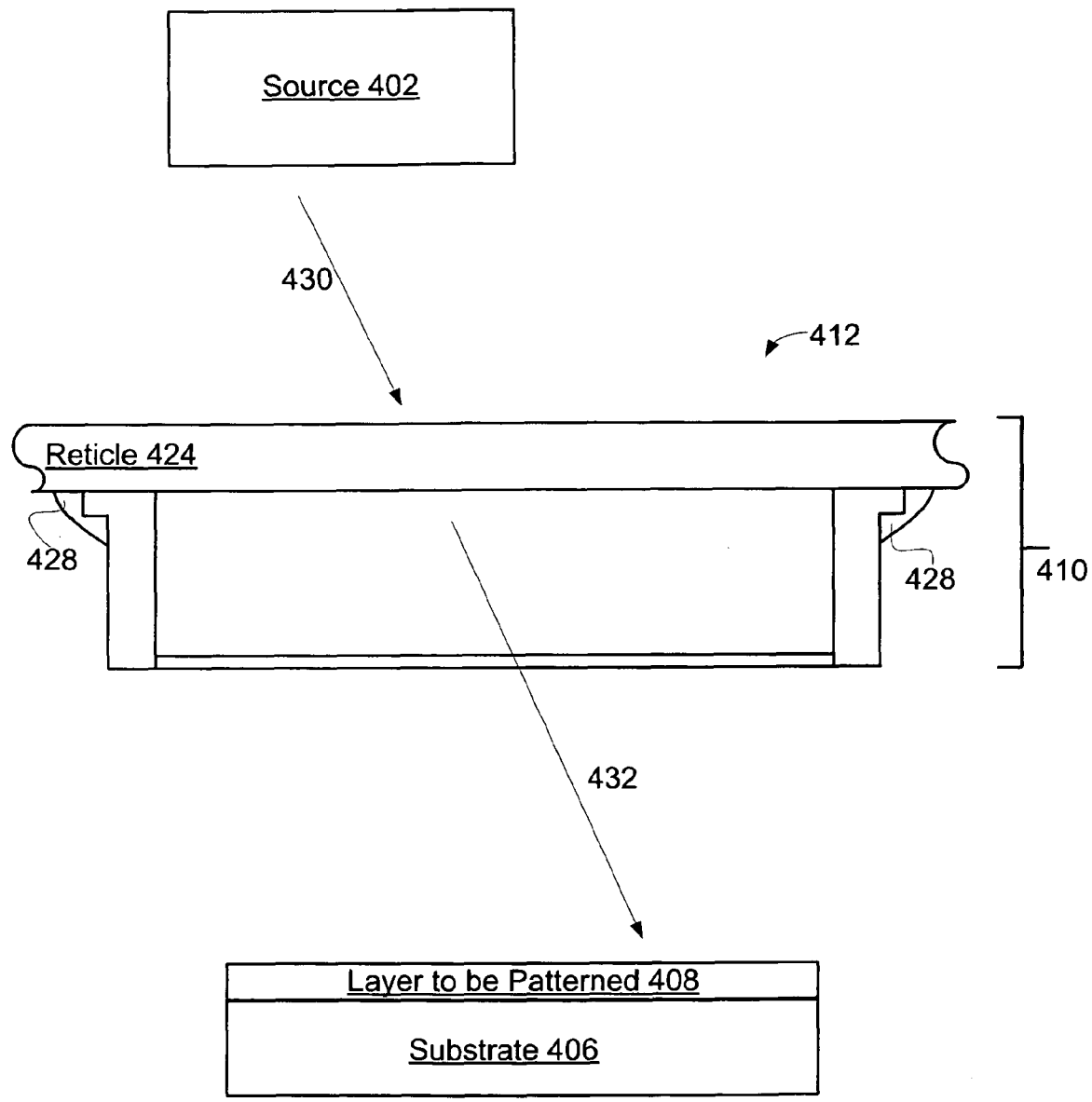
FIG. 14 illustrates a second patterning step used to pattern the layer to be patterned.

FIGS. 13 and 14 are cross sectional side views that illustrate the use of reticles 114, 424 and pellicles 102, 412 attached with soft adhesives 118, 428 in a multiple patterning lithography process.

FIG. 13 illustrates a first patterning of a layer to be patterned 408 with a first pellicle-reticle assembly 404. There is a source 402 of radiation, which can be an ultra-violet light source 402, an extreme ultraviolet light source 402 or a source 402 of another type of radiation. Radiation 403 from the source travels to the reticle 114 and is diffracted. The diffracted radiation 407 contains a pattern based on the pattern present in the reticle 114. This diffracted radiation 407 interacts with a layer to be patterned 408. This layer to be patterned 408 may be any material or materials to be patterned in the lithography process. The layer 408 may be, for example, a layer of photoresist on a substrate 406. The substrate 406 may comprise any material or materials on which devices may be built. In one example, substrate 406 comprises silicon, although another material or other materials may be used in other examples. The substrate 406 may be a portion of a bulk substrate, such as a wafer of single crystal silicon, a silicon-on-insulator (SOI) substrate 406 such as a layer of silicon on a layer of insulating material on another layer of silicon, a germanium substrate 406, a group III-V material (such as GaAs, InSb, InAl, etc.) substrate 406 may be a substrate 406 comprising multiple layers of materials, may already have devices present or lack them, or may another type of substrate 406 comprising another material or materials.

Note that the lithography system illustrated in FIG. 13 is a simplification and may omit one or several components. Further, the light may be diffracted and or focused one or more times in addition to the single diffraction shown. In some embodiments, the light may reflect from the reticle 114 rather than be diffracted by it. There are a wide variety of lithography patterning systems that may be used with the reticle-pellicle assembly 404 having the reticle 114 attached to the pellicle 102 with the soft adhesive 118.

The pattern transferred to the layer to be patterned 408 may be only part of the entire pattern desired to be transferred. Thus, one or more additional patterning steps may be used.

FIG. 14 illustrates a second patterning step used to pattern the layer to be patterned 408. The same source 402, substrate 406, and layer to be patterned 408 are present, but a different second pellicle-reticle assembly 410 with a different reticle 424 attached to a different pellicle 412 by soft adhesive 428 is used. The second reticle 424 has a different pattern than the first reticle 114. Thus the light from the source 430 is reflected from the reticle 424 and the reflected light 432 carries a different pattern to the layer to be patterned 408. The combination of patterns from the first reticle 114 and second reticle 424 are used to pattern the layer to be patterned 408, with part of the desired pattern coming from the first reticle 114 and part from the second reticle 424. While a double patterning process is described and shown, multiple patterning lithography with more than two reticles may also be used.

Via multiple patterning, a pattern may be transferred to the layer to be patterned 408 with a smaller pitch than would be possible using just one reticle. As the use of soft adhesive 118 reduces the distortion of the reticles, the various patterns may be superimposed with more accuracy, making multiple patterning lithography easier to accomplish.

Additionally, the soft adhesive 118 used may provide further advantages of allowing easier removal of the pellicle 102 from the reticle 114 without damaging either. This may allow a new pellicle 102 to be applied to the reticle 114 and the reticle 114 to be reused more frequently than if a harder adhesive were used, saving costs.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method to attach a pellicle to a reticle, comprising:
   placing a pellicle on top of a reticle, a bottom surface of the pellicle contacting a top surface of the reticle, wherein at least a portion of the pellicle includes an exterior surface which substantially vertically contacts the reticle;
   applying, after placing the pellicle on the reticle, an adhesive to contact the exterior surface of the pellicle and a top surface of the reticle, with substantially no adhesive between a bottom surface of the pellicle and the top surface of the reticle, the adhesive attaching the reticle to the pellicle.

2. The method of claim 1, wherein, during the time the adhesive is applied, a force between the pellicle and the reticle and normal to the reticle surface is not substantially greater than the weight of the pellicle.

3. The method of claim 1, wherein the pellicle comprises a pellicle frame and pellicle membrane.

4. The method of claim 1, wherein the adhesive has a shear modulus less than 2.5.

5. The method of claim 1, wherein the adhesive is applied to a perimeter of the pellicle through a nozzle.

6. The method of claim 1, wherein the maximum three sigma distortion in the reticle after application of the adhesive is less than 4.0 nm.

7. The method of claim 1, wherein the reticle and pellicle are used for one patterning exposure of a multiple patterning exposure process, the multiple patterning exposure process comprising patterning a single patterning material layer by use of multiple reticles.

8. A lithography structure, comprising:
   a reticle;
   a pellicle on the reticle, wherein the pellicle comprises a pellicle frame with at least a portion of an exterior surface vertically contacting a top surface of the reticle; and
   adhesive to attach the pellicle to the reticle, with substantially no adhesive being directly between a bottom surface of the pellicle and the reticle top surface, wherein the adhesive adheres the pellicle exterior surface to the reticle top surface.

9. The structure of claim 8, wherein the adhesive has a shear modulus less than 2.5.

10. The structure of claim 8, wherein the maximum three sigma distortion in the reticle with the pellicle attached compared to without the pellicle attached is less than 4.0 nm.

11. The structure of claim 8, wherein the exterior of the pellicle frame has a portion that does not extend vertically from the reticle.

12. The structure of claim 8, wherein the exterior of the pellicle frame has a stepped cross section, the stepped exterior of the pellicle frame having at least one horizontal portion in addition to at least one vertical portion.

13. The structure of claim 12, wherein the adhesive adheres to at least one horizontal portion of the stepped exterior of the pellicle frame and at least one vertical portion of the stepped exterior of the pellicle frame.

14. The structure of claim 8, wherein the exterior of the pellicle frame has a cross section with an angled exterior portion that is neither vertical nor horizontal relative to the top surface of the reticle.

15. A method, comprising:
providing a pellicle comprising a pellicle frame having an exterior surface;
positioning the pellicle adjacent a reticle, wherein at least a portion of the pellicle frame exterior surface substantially vertically contacts the reticle;
applying an adhesive in contact with the pellicle and the reticle to adhere the pellicle to the reticle; and
wherein the maximum three sigma distortion in the reticle with the pellicle attached compared to prior to pellicle attachment is less than 4.0 nm.

16. The method of claim 15, further comprising using the pellicle adhered to the reticle in a multiple patterning lithography process.

17. The method of claim 15, wherein the adhesive is a soft adhesive with a shear modulus less than 2.5.

18. The method of claim 17, wherein the adhesive is applied to be in contact with an exterior of the pellicle and a top surface of the reticle, with substantially none of the adhesive being directly between a bottom of the pellicle and a top surface of the reticle.

* * * * *